United States Patent
Manhaeve et al.

(10) Patent No.: US 7,315,974 B2
(45) Date of Patent: Jan. 1, 2008

(54) METHOD FOR DETECTING FAULTS IN ELECTRONIC DEVICES, BASED ON QUIESCENT CURRENT MEASUREMENTS

(75) Inventors: Hans Manhaeve, Sint-Michiels (BE); Piet De Pauw, Oudenaarde (BE)

(73) Assignee: Q-Star Test N.V., Bruges (BE)

( * ) Notice: Subject to any disclaimer, the term of this patent is extended or adjusted under 35 U.S.C. 154(b) by 325 days.

(21) Appl. No.: 10/444,473

(22) Filed: May 22, 2003

(65) Prior Publication Data
US 2004/0006731 A1 Jan. 8, 2004

(30) Foreign Application Priority Data
May 23, 2002 (EP) .................. 02447094

(51) Int. Cl.
*G01R 31/30* (2006.01)
(52) U.S. Cl. .................. 714/745; 714/25; 702/64; 324/523
(58) Field of Classification Search .................. None
See application file for complete search history.

(56) References Cited

U.S. PATENT DOCUMENTS

| | | | |
|---|---|---|---|
| 5,519,333 A * | 5/1996 | Righter | 324/765 |
| 5,731,700 A * | 3/1998 | McDonald | 324/158.1 |
| 5,889,409 A * | 3/1999 | Kalb, Jr. | 324/765 |
| 6,043,662 A * | 3/2000 | Alers et al. | 324/520 |
| 6,342,790 B1 * | 1/2002 | Ferguson et al. | 324/765 |
| 6,812,724 B2 * | 11/2004 | Rao et al. | 324/763 |

OTHER PUBLICATIONS

Maxwell et al., "Current Ratios: A Self-Scaling Technique for Production IDDQ Testing", ITC Test Conference, 1999, IEEE, pp. 738-746.*
Okuda. "Eigen Signatures for Regularity-Based IDDQ testing." Proceedings of the VLSI Test Symposium 2002, pp. 289-294.
Maxwell et al. "Current Ratios: A Self-Scaling Technique for Production IDDQ Testing." Proceedings of the International Test Conference ITC'99, paper 28.4, pp. 738-746.
Kruseman et al. "The Future of Delta-IDDQ Testing." Proceedings of the International Test Conference ITC 2001, paper 4.3, pp. 101-110.

* cited by examiner

*Primary Examiner*—Guy Lamarre
*Assistant Examiner*—John P. Trimmings
(74) *Attorney, Agent, or Firm*—Merchant & Gould P.C.

(57) ABSTRACT

The present invention is related to a method for testing a micro-electronic device, by applying a plurality of test vectors to said device, and measuring for each test vector, the quiescent supply current $I_{DDQ}$, to said device, wherein each $I_{DDQ}$ measured value is divided by another $I_{DDQ}$ value, and wherein the result of said division is compared to a predefined reference, resulting in a pass or fail decision for said device.

7 Claims, 12 Drawing Sheets
(8 of 12 Drawing Sheet(s) Filed in Color)

METHOD FOR DETECTING FAULTS IN ELECTRONIC DEVICES, BASED ON QUIESCENT CURRENT MEASUREMENTS

BACKGROUND OF THE INVENTION

1. Field of the Invention

The present invention is related to methods for testing micro-electronic devices, such as CMOS devices, by monitoring the 'quiescent current' $I_{DDQ}$, for a set of test vectors applied to the device under test.

2. Prior Art $I_{DDQ}$ monitoring is a widely applied technique for fault detection in micro-electronic devices. A device-under-test (DUT) is subjected to a predefined series of test vectors, which are basically digital inputs, applied to the DUT at every pulse of the operational clock frequency. The DUT receives a supply current, generated by a supply voltage $V_{DUT}$. The switching action of the DUT, in most cases related to an 'active' (rising or falling) edge of the clock signal, is accompanied by a sharp peak in the supply current, which can reach levels in the order of amps or higher. After such a peak, the current returns to a low level (typically not more than 10 mA), called the 'quiescent current' $I_{DDQ}$. This level is representative of the quality of components on the DUT. $I_{DDQ}$ levels must remain within narrow limits for given DUT operating conditions (temperature, voltage): in particular a sharp (vector related) rise of the $I_{DDQ}$ is indicative of component failures.

Existing $I_{DDQ}$ monitors are based on this basic principle: these monitors measure the $I_{DDQ}$ level, compare it to a predefined level, and deliver a pass/fail signal, indicating whether the DUT is operating properly or not. Most monitors allow additional features, such as the output of the $I_{DDQ}$ value, the measurement of current signatures, or the assessment of delta-$I_{DDQ}$ values. This means that subsequent $I_{DDQ}$ values are subtracted, and compared to a reference value for this delta value.

A problem with these standard techniques, in particular the fixed reference, is that $I_{DDQ}$ levels can vary from one device to the other, even between devices of the same type. This makes it difficult to define a fixed reference level for a given device type: it may be possible that for some individual devices, the reference is closely approached or even exceeded by the measured $I_{DDQ}$ levels, even though no error occurs on the tested device. The same goes for delta $I_{DDQ}$ values, which may be higher for a device which has, on average, a higher $I_{DDQ}$ level, than for a device of the same type, with a lower average $I_{DDQ}$. A solution to overcome the above mentioned problems could be to widen the acceptance criteria. However, this approach has the disadvantage of losing device screening efficiency with as a result that bad parts may not be properly identified as such.

Modern Integrated Circuits are heading into the deep-submicron area in terms of component size. This is leading to an increase in background leakage current. The result is that the $I_{DDQ}$ is composed of this large, non-defect-related background current, and a small defect-related current. For deep submicron IC technologies, the current caused by an IC defect (short, bridging fault, open, gate oxide leakage, ... ) in many cases could become very small, e.g. below 1 μA. On the other hand, when comparing one IC to the other, the variation in off state current of the different transistors on the IC, is large.

These variations in off state leakage current, are due to process fluctuations, which affect to a large extent all transistors on the IC. Examples are gate length definition, doping concentration under the gate, . . . For a deep submicron IC process (e.g. 0.13 um CMOS), used to fabricate an IC with a large number of transistors (1 million of transistors or more), the variation in IC off state leakage current can be orders of magnitude larger than the leakage current caused by a single IC defect. This makes it impossible for deep submicron circuits to use absolute leakage current levels, in order to separate "good IC's" from "IC's with a defect".

The most relevant prior art can be found in:

Y. Okuda, *Eigen Signatures for Regularity-Based IDDQ testing*, Proceedings of the VLSI Test Symposium 2002, pp 289-294 (ISBN 0-7695-1570-3)

P. Maxwell et al, *Current Ratios: A Self-Scaling Technique for Production IDDQ Testing*, Proceedings of the International Test Conference ITC'99, paper 28.4, pp 738-746

B. Kruseman et al, *The Future of Delta-IDDQ Testing*, Proceedings of the International Test Conference ITC'2001, pp 101-110

SUMMARY OF THE INVENTION

The present invention is related to a method for testing a micro-electronic device, by applying a plurality of test vectors to said device, and measuring for each test vector, the quiescent supply current $I_{DDQ}$, to said device, wherein each $I_{DDQ}$ measured value is divided by another $I_{DDQ}$ value, and wherein the result of said division is compared to a predefined reference, resulting in a pass or fail decision for said device.

Said pass or fail decision is preferably made on the basis of whether or not said result of said division is lying in a range of values comprising said predefined reference.

Said reference may be a vector-related reference. Said vector-related reference may be obtained by the following steps:

Taking a random production sample of micro-electronic devices of the same type,

For each device of the sample: measuring the $I_{DDQ}$ value for a given reference test vector and measuring the $I_{DDQ}$ value for each of the other $I_{DDQ}$ test vectors, For each device of the sample: calculating the relative $I_{DDQ}$ value of each $I_{DDQ}$ measurement, by dividing each measurement by the $I_{DDQ}$ value related to the chosen reference vector, For each $I_{DDQ}$ vector, for all devices of the sample: determining the mean and the sigma of the relative $I_{DDQ}$ values, For each $I_{DDQ}$ vector, for all devices of the sample: omitting all outlying relative $I_{DDQ}$ measurements, For each $I_{DDQ}$ vector: determining the mean and the sigma of the relative $I_{DDQ}$ values without the outlying relative $I_{DDQ}$ measurements, thereby obtaining said vector-related reference.

Said reference may also be 1, in which case the acceptance range could be [0.9; 1.1].

According to a particular embodiment, said reference is derived from a graph showing the maximum measured $I_{DDQ}$ level as a function of the minimum measured $I_{DDQ}$ level, for a number of micro-electronic devices.

According to a preferred embodiment, the measured value is also compared to an absolute (specification) reference and the pass or fail decision is a combined result of both comparisons.

BRIEF DESCRIPTION OF THE FIGURES

The patent or application file contains at least one drawing executed in color. Copies of this patent or patent application publication with color drawings(s) will be provided by the Office upon request and payment of the necessary fee.

DETAILED DESCRIPTION

Figure 1:
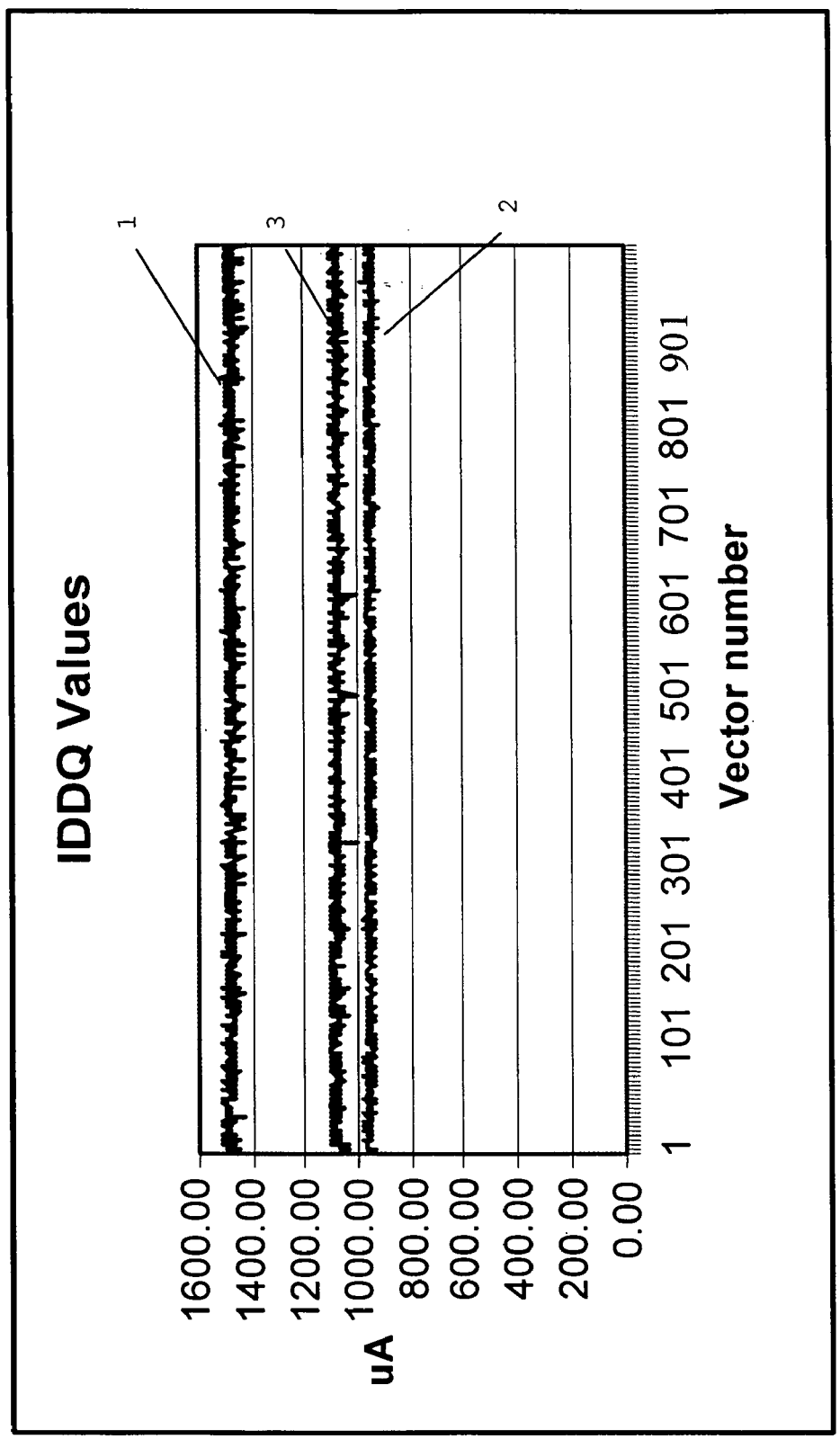
FIG. 1 is a graph comprising absolute $I_{DDQ}$ current values for three devices, for a number of test vectors.

The present invention is related to a method for assessing $I_{DDQ}$ measurements in a new way. The method is referred as 'relative $I_{DDQ}$'. Of a series of $I_{DDQ}$ measurements, taken in relation to a series of test vectors, the ratio of each measured value to a reference or to a previous value is calculated, and assessed with respect to a reference value, for example 1. In addition the measured values are preferably also compared against a specification related limit. In this way, devices are rejected either because they contain a failure or because they do not meet the specification requirements.

This method is independent of a fixed reference of the $I_{DDQ}$ level. Differences in $I_{DDQ}$ level, which are due for example to high background current, but which are not an indication of component failure on a particular DUT, are not detected as such. Preferably, variations between subsequent $I_{DDQ}$ measured values on a DUT are also sufficiently limited to be able to use this method. This is mostly true, as a consequence of the so called 'Matching Theory', which is related to a phenomenon which is increasingly applicable in new micro-electronic devices and is exploited in most analogue circuit designs. The increase in the number of transistors per IC results in a better matching of the IC leakage currents in the different states of the IC. This effect results in a reduced $I_{DDQ}$ variation from vector to vector, for a single IC.

However, this degree of matching can not be obtained between a component on one device, and a similar component on another device. Therefore, the difference in $I_{DDQ}$ level between test vectors on the same device, tends to become smaller and smaller, so that the 'relative $I_{DDQ}$' is closer and closer to 1. Any abrupt deviation from this value immediately indicates a failure. The advantage of the relative approach can be understood by considering the following example. A batch of good IC devices may have $I_{DDQ}$ levels ranging from 10 µA to 300 µA. An absolute $I_{DDQ}$ acceptance limit should therefore be put at at least 300 µA, meaning that the total defect-related $I_{DDQ}$ current of a device under test, i.e. the leakage current plus the actual defect current, must exceed 300 µA before a fail signal is given. Smaller defect currents remain undetected. One could devise a system wherein an acceptance limit is introduced which is dependent on the tested device, but it would be difficult to define such a limit before knowing whether the device is good or bad.

With the relative method, each $I_{DDQ}$ level is divided by for example the $I_{DDQ}$ of a given vector, e.g. the first test vector. When the matching theory is applicable, the levels of these relative $I_{DDQ}$ values will be close to 1, for every device of the batch.

Suppose that for a first test vector, one device draws an $I_{DDQ}$ level of 10 µA and another draws an $I_{DDQ}$ of 100 µA, both being good devices.

Suppose that a second test vector activates a fault in the first device, resulting in a fault-indicating level of 15 µA in said first device, while non-fault indicating levels—for this device—are within the range of 9-11 µA. An absolute acceptance level for this type of device should be at least 100 µA (given the second device), so that the faulty 15 µA would go undetected. The relative approach according to the invention would reveal a relative $I_{DDQ}$ level of 1.5, which would be immediately detected, as it exceeds the normal acceptance range of 0.9 to 1.1. This illustrates the capabilities of the relative approach.

The method of the invention is equally applicable for obtaining a so-called 'signature' relative $I_{DDQ}$ measurement. This may be the case when the matching theory does not apply, for example in a device containing both digital and analog parts. In this case, the measured current may be a combination of leakage (from the digital part) and active current (from the analog part), where the active current is a function of the applied test vector. This would mean that for some vectors, a low $I_{DDQ}$ should be regarded as 'good', while for other vectors, a high acceptance level should be taken into account. This can be incorporated into the relative $I_{DDQ}$ measurement by determining a vector dependent relative $I_{DDQ}$ reference, or 'golden device' reference, as explained in more detail hereafter.

Two particular embodiments are to be noted in terms of the way in which relative $I_{DDQ}$ value is calculated:

'vector-to-vector': wherein each $I_{DDQ}$ measured value is divided by the previous $I_{DDQ}$ value, 'vector-to-first-vector': wherein each $I_{DDQ}$ measured value is divided by the $I_{DDQ}$ of the first vector applied.

DESCRIPTION OF PARTICULAR EMBODIMENTS

1. Relative IDDQ Close to 1

The following formulas illustrate the calculation of relative IDDQ values when the matching theory applies, i.e. when the IDDQ ratio, for example in a vector-to-first-vector scheme, approaches 1 for a good device.

Applied Notations:

$I_{DDQ}\_x$ = absolute $I_{DDQ}$ value for measurement $x$ $R\_xy$ = *relative* $I_{DDQ}$ value for measurement $x$ in relation to measurement $y$ $D\_xy$ = delta $I_{DDQ}$ value for measurement $x$ in relation to measurement $y$ For a good device:

$I_{DDQ\_}1$ $I_{DDQ\_}2 = I_{DDQ\_}1 + D\_21$ $I_{DDQ\_}3 = I_{DDQ\_}2 + D\_32 = I_{DDQ\_}1 + D\_21 + D\_32$ $I_{DDQ\_}4 = I_{DDQ\_}3 + D\_43 = I_{DDQ\_}1 + D\_21 + D\_32 + D\_43$ $\vdots$ $I_{DDQ\_}n = I_{DDQ\_}n-1 + D\_nn-1 = I_{DDQ\_}1 + D\_21 + D\_32 + D\_43 + \ldots + D\_nn-1$ For a device with high leakage currents and taken into consideration the matching theory, then $I_{DDQ}\_x \gg D\_xy$ and $SUM(D\_xy) \sim 0$ if sufficient measurements are taken.

From a relative perspective:

$R\_11 = I_{DDQ\_}1 / I_{DDQ\_}1$ $R\_21 = I_{DDQ\_}2 / I_{DDQ\_}1 = (I_{DDQ\_}1 + D\_21)/I_{DDQ\_}1 = 1 + (D\_21/I_{DDQ\_}1)$ $R\_31 = I_{DDQ\_}3 / I_{DDQ\_}1 = (I_{DDQ\_}1 + D\_21 + D\_32)/I_{DDQ\_}1 = 1 + ((D\_21 + D\_32)/I_{DDQ\_}1)$ $\vdots$ $R\_n1 = I_{DDQ\_}n / I_{DDQ\_}1 = (I_{DDQ\_}1 + D\_21 + D\_32 + D\_43 + \ldots + D\_nn-1)/I_{DDQ\_}1$ $= 1 + ((D\_21 + D\_32 + D\_43 + \ldots + D\_nn-1)/I_{DDQ\_}1)$ Starting from the same premises: $I_{DDQ}\_x \gg D\_xy$ and $SUM(D\_xy) \sim 0$, then $Dxy/I_{DDQ}\_x \ll 1$ and $SUM(D\_xy)/I_{DDQ}\_x \sim 0$, resulting in the fact that for a good device $R\_xy \sim 1$.

The same remains valid if vector to vector ratios are taken instead of the vector to first vector ratio as in the example.

In the extreme case $I_{DDQ}\_1$ is the vector with minimum leakage. In that case $SUM(D\_xy)max = I_{DDQ}\_MAX - I_{DDQ}\_MIN = D\_xy\ max$. Then, given that the condition $I_{DDQ}\_x \gg D\_xy$ is fulfilled then $R\_xy \sim 1$, within certain limits, for example $R\_xy$ between 0.9 and 1.1.

For a bad device—vector 3 being the one activating the defect:

$I_{DDQ\_}1$ $I_{DDQ\_}2 = I_{DDQ\_}1 + D\_21$ $I_{DDQ\_}3 = I_{DDQ\_}2 + D\_32 + I\_{DEFECT}$ $= I_{DDQ\_}1 + D\_21 + D\_32 + I\_{DEFECT}$ $I_{DDQ\_}4 = I_{DDQ\_}3 + D\_43$ $= I_{DDQ\_}1 + D\_21 + D\_32 + D\_43 + I\_{DEFECT}$ $\vdots$ $I_{DDQ\_}n = I_{DDQ\_}n-1 + D\_nn-1 = I_{DDQ\_}1 + D\_21 + D\_32 + D\_43 + \ldots + D\_nn-1 + I\_{DEFECT}$ For a device with high leakage currents and taken into consideration the matching theory, then $I_{DDQ}\_x \gg D\_xy$ and $SUM(D\_xy) \sim I\_{DEFECT}$ if sufficient measurements are taken and assuming a single defect.

From a relative perspective:

$$R\_11 = I_{DDQ}\_1 / I_{DDQ}\_1$$

$$R\_21 = I_{DDQ}\_2 / I_{DDQ}\_1 = (I_{DDQ}\_1 + D\_21) / I_{DDQ}\_1 = 1 + (D\_21 / I_{DDQ}\_1)$$

$$R\_31 = I_{DDQ}\_3 / I_{DDQ}\_1 = (I_{DDQ}\_1 + D\_21 + D\_32 + I_{\_DEFECT}) / I_{DDQ}\_1$$
$$= 1 + ((D\_21 + D\_32) / I_{DDQ}\_1) + (I_{\_DEFECT} / I_{DDQ}\_1)$$

$$\vdots$$

$$R\_n1 = I_{DDQ}\_n / I_{DDQ}\_1$$
$$= (I_{DDQ}\_1 + D\_21 + D\_32 + D\_43 + \ldots + D\_nn-1 + I_{\_DEFECT}) / I_{DDQ}\_1$$
$$= 1 + ((D\_21 + D\_32 + D\_43 + \ldots + D\_nn-1) / I_{DDQ}\_1) + (I_{\_DEFECT} / I_{DDQ}\_1)$$

Starting from the same premises: $I_{DDQ}\_x \gg D\_xy$ and $SUM(D\_xy) \sim 0$, then $Dxy/I_{DDQ}\_x \ll 1$ and $SUM(D\_xy)/I_{DDQ}\_x \sim 0$, resulting in the fact that for the bad device $R\_xy \sim 1 + (I_{\_DEFECT}/I_{DDQ}\_1)$.

Depending on the ratio between $I_{\_DEFECT}$ and $I_{DDQ}\_1$ a measurement with sufficient resolution and repeatability is required to identify the failure. It is to be noted that for the relative method of the invention, it is mainly the repeatability of the $I_{DDQ}$ measurement which has to be of a high standard, more so than the absolute accuracy of the $I_{DDQ}$ currents.

The same remains valid if vector to vector ratios are taken instead of the vector to first vector ratio as in the example.

In the extreme case $I_{DDQ}\_1$ is the vector with minimum leakage. In that case $SUM(D\_xy)max = I_{DDQ}\_MAX - I_{DDQ}\_MIN = D\_xy$ max. Then, given that the condition $I_{DDQ}\_x \gg D\_xy$ is fulfilled then $R\_xy \sim 1 + (I_{\_DEFECT}/I_{DDQ}\_1)$ 2. Relative $I_{DDQ}$ Signature The following is a description of the method steps, in case the relative $I_{DDQ}$ is obtained by dividing each $I_{DDQ}$ measured value by a reference value and wherein a vector-related reference is used, i.e. a relative $I_{DDQ}$ signature measurement.

Preparation of Production Test:

Step one: choose the $I_{DDQ}$ reference test vector. E.g. The first test vector.

Step two: Determination of the relative $I_{DDQ}$ signature of a defect free IC, relative to the chosen $I_{DDQ}$ test vector (=golden relative $I_{DDQ}$ signature). This procedure includes the determination of the mean and the sigma of the relative $I_{DDQ}$ value for each $I_{DDQ}$ test vector.

Step three: Determination of the pass/fail criteria for each relative $I_{DDQ}$ vector: E.g. When the pass interval is chosen to be: [Relative $I_{DDQ}$ mean-3*sigma, Relative $I_{DDQ}$ mean+3*sigma], then all IC's with one or more relative $I_{DDQ}$ values falling outside this pass interval are considered as fails.

Step two of the above described procedure (Determination of the relative $I_{DDQ}$ signature of a defect free IC) is described hereafter in more detail.

Take a random production sample of IC's of the same product: e.g. 100 IC's.

For each IC of the sample: Measure the $I_{DDQ}$ value for the chosen reference test vector and measure the $I_{DDQ}$ value for each of the other $I_{DDQ}$ test vectors.

For each IC of the sample: Calculate the relative $I_{DDQ}$ value of each $I_{DDQ}$ measurement, by dividing each measurement by the $I_{DDQ}$ value of the chosen reference vector.

For each $I_{DDQ}$ vector, for all IC's of the sample: Determine the mean and the sigma of the relative $I_{DDQ}$ value.

For each $I_{DDQ}$ vector, for all IC's of the sample: Omit all outlying relative $I_{DDQ}$ measurements (e.g. Outside 3 sigma limits)=removal of the freaks.

For each $I_{DDQ}$ vector: Determine the mean and the sigma of the freak free population.

This 'mean' and 'sigma' for each $I_{DDQ}$ vector constitute the relative $I_{DDQ}$ values of the golden device.

Data Processing and Pass/Fail Decision During Production Test:

For each manufactured IC (of the same product), all $I_{DDQ}$ measured values are compared against the specification limit and divided by the leakage current value measured with the reference $I_{DDQ}$ test vector.

Pass/fail decision for each manufactured device, can be made immediately following $I_{DDQ}$ measurements of that device, based on the absolute and relative $I_{DDQ}$ values:

Pass=the absolute values of all $I_{DDQ}$ values are below the specification limit and the relative $I_{DDQ}$ values of ALL $I_{DDQ}$ test vectors for the device under test are within the pass interval of the golden device.

Fail=at least one absolute $I_{DDQ}$ value is above the specification limit or at least one relative $I_{DDQ}$ value of an $I_{DDQ}$ test vector for the device under test falls outside the pass interval determined for this $I_{DDQ}$ test vector.

The present invention is however related to any method wherein a relative $I_{DDQ}$ is used, i.e. wherein a measured $I_{DDQ}$ value is divided by another $I_{DDQ}$ value, after which the result is compared to a reference for this relative $I_{DDQ}$. In another embodiment, relative $I_{DDQ}$ values are compared to reference value '1'. According to a special embodiment, each $I_{DDQ}$ measured value, obtained by applying a series of test vectors, is divided by the $I_{DDQ}$ value obtained for the previous test vector. A criteria for acceptance may then be that each relative $I_{DDQ}$ must be within the interval [0.9; 1.1], in order for the DUT to pass.

The relative $I_{DDQ}$ approach is an IC test data processing procedure, with the following advantages:

Easy to determine pass/fail criteria

High accuracy of pass/fail decision

Technology independent. Easily applicable to new technologies and new products.

Relaxed $I_{DDQ}$ testability requirements: additional sources of leakage currents in the IC are allowed, as long as they are stable in time.

During production test: minimal data processing and immediate pass/fail decision.

Applicability to new IC technologies:

The relative $I_{DDQ}$ technique can be applied on the new IC technologies, having a larger leakage current than the previous generations.

Applicability depends on the accuracy of the $I_{DDQ}$ measurement unit. Higher IC leakage current levels, and smaller transistor sizes require an increased accuracy of the $I_{DDQ}$ monitor.

TEST RESULTS

Example 1

3 Dies (IC Devices) from a Same Production Process

Absolute $I_{DDQ}$ values for these three dies are shown in the graph in FIG. 1. The X-axis represents a number of test vectors.

Die n° 1 (curve 1) has typical readings around 1450 μA, die n° 2 (curve 2) has measurement results around 950 μA and die n° 3 (curve 3) has measurement results around 1080 μA, as shown in the figure below. These 3 dies are good dies.

Figure 2A:
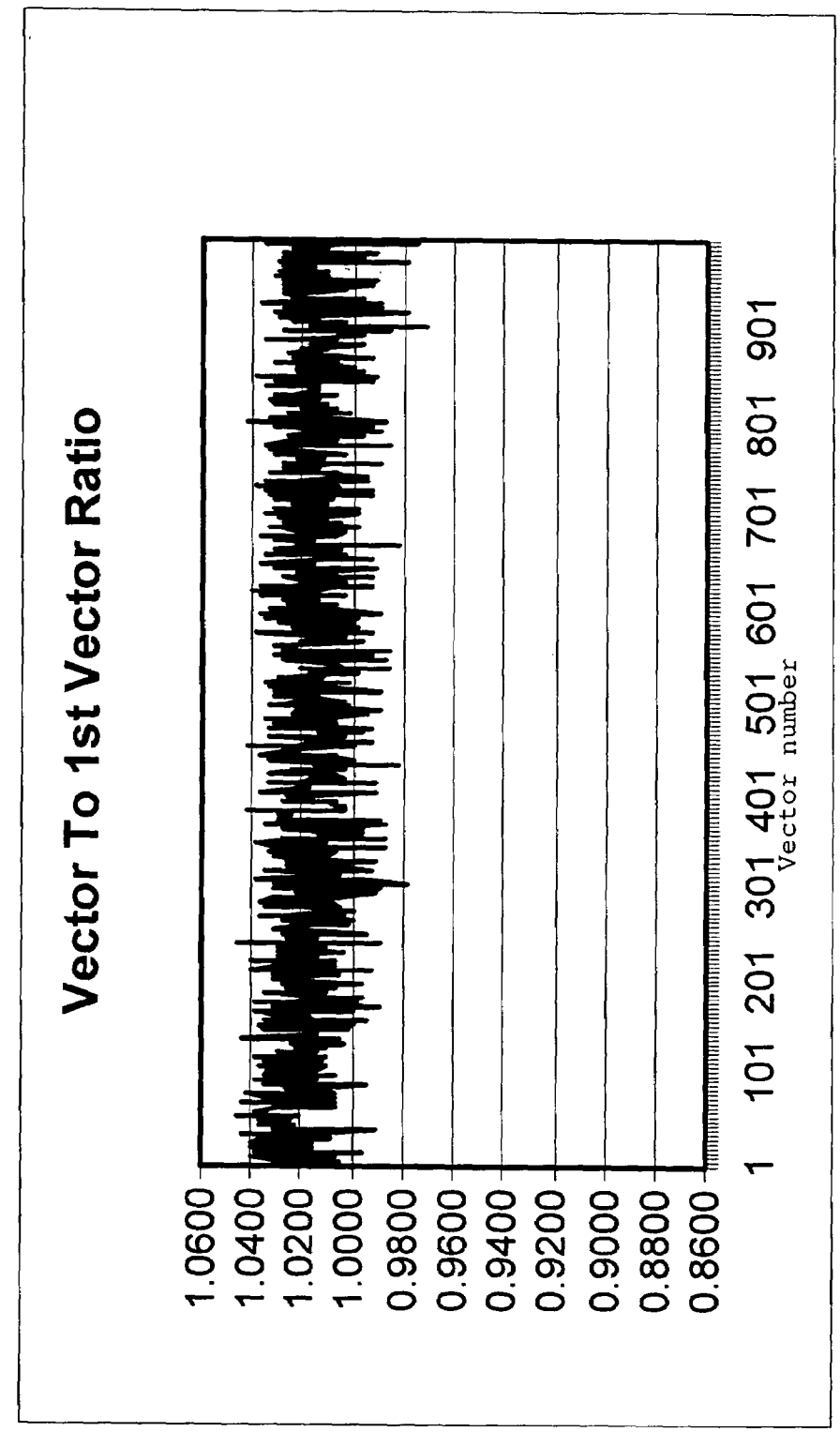
FIGS. 2a, 2b and 2c show the vector-to-first-vector $I_{DDQ}$ ratios (relative $I_{DDQ}$ values) for the three devices of FIG. 1.
Figure 2B:
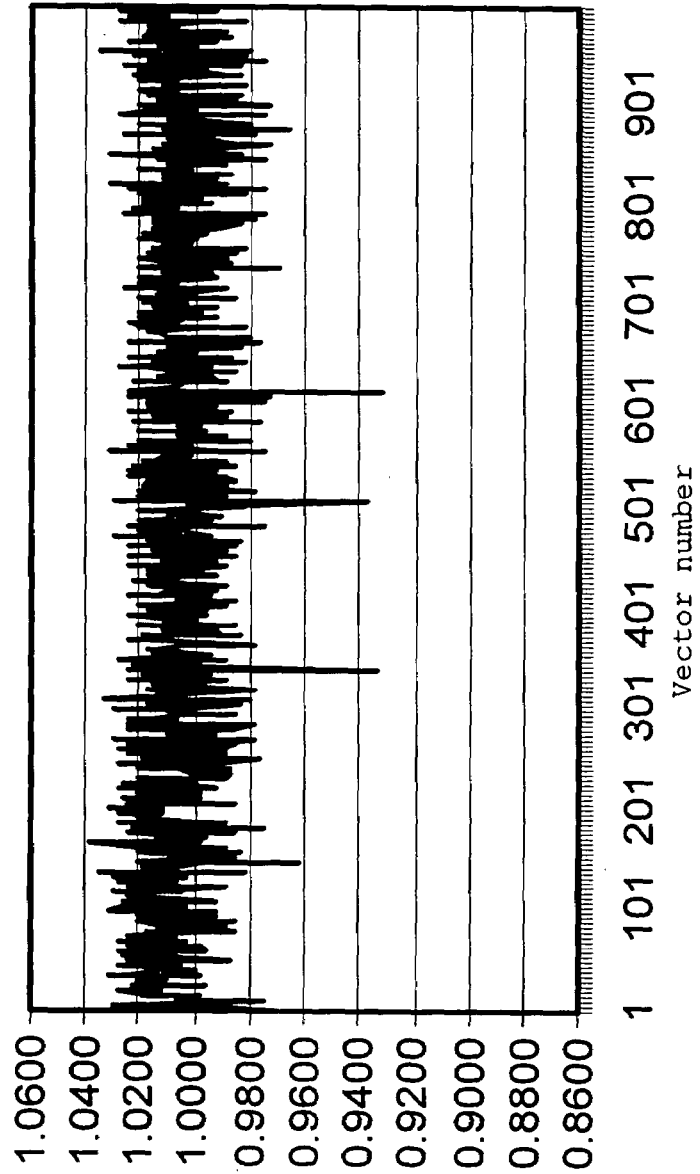
Figure 2C:
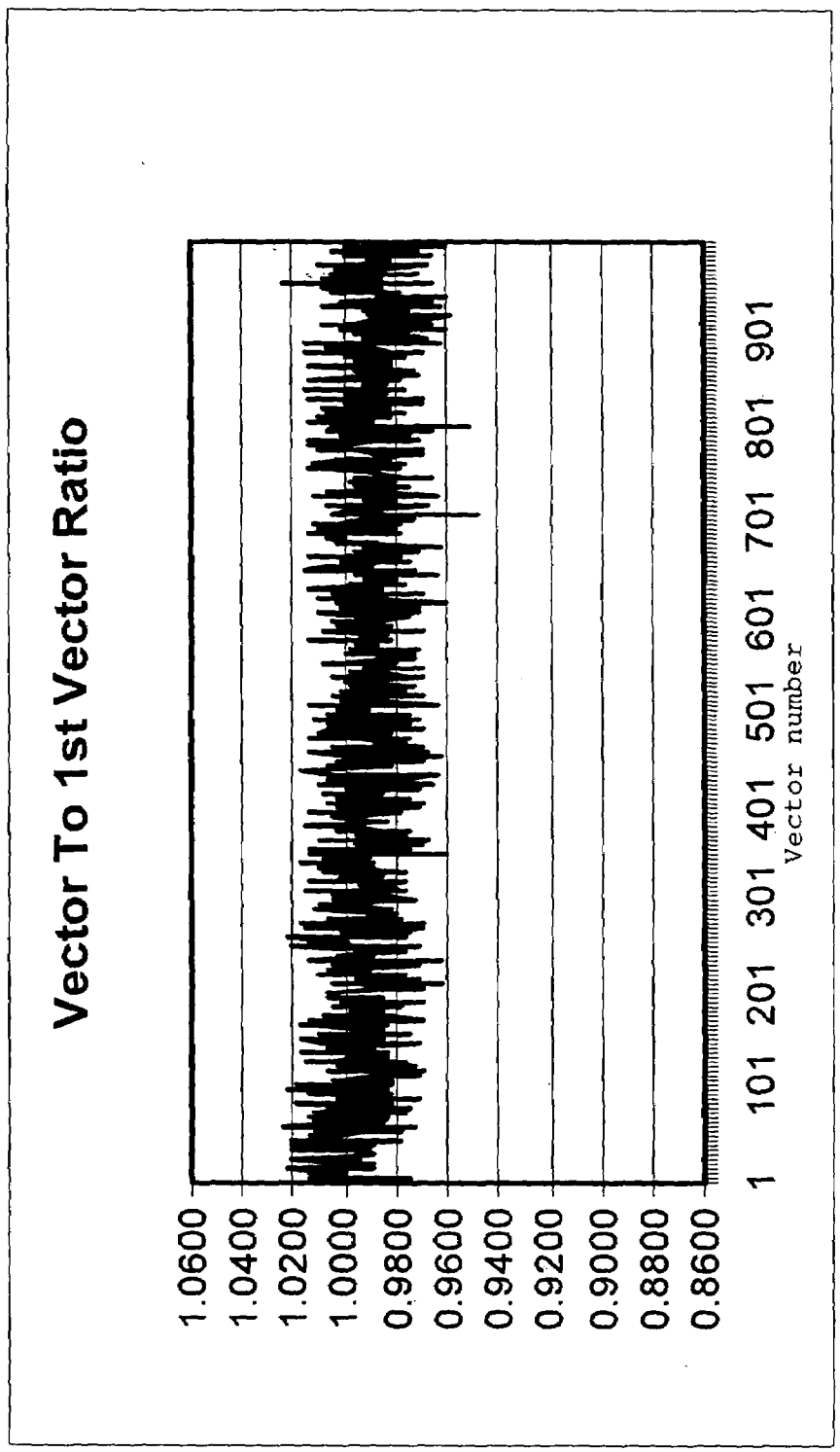

The graphs in FIGS. 2a, 2b et 2c show respectively the calculated "vector to first vector" ratio for these three dies. It is clear to see that the ratio values are around 1, irrespective of the absolute current drawn by the device.

Example 2

Samples from a Production Lot with 11420 Good and 18 Functional Bad Devices

Figure 3:
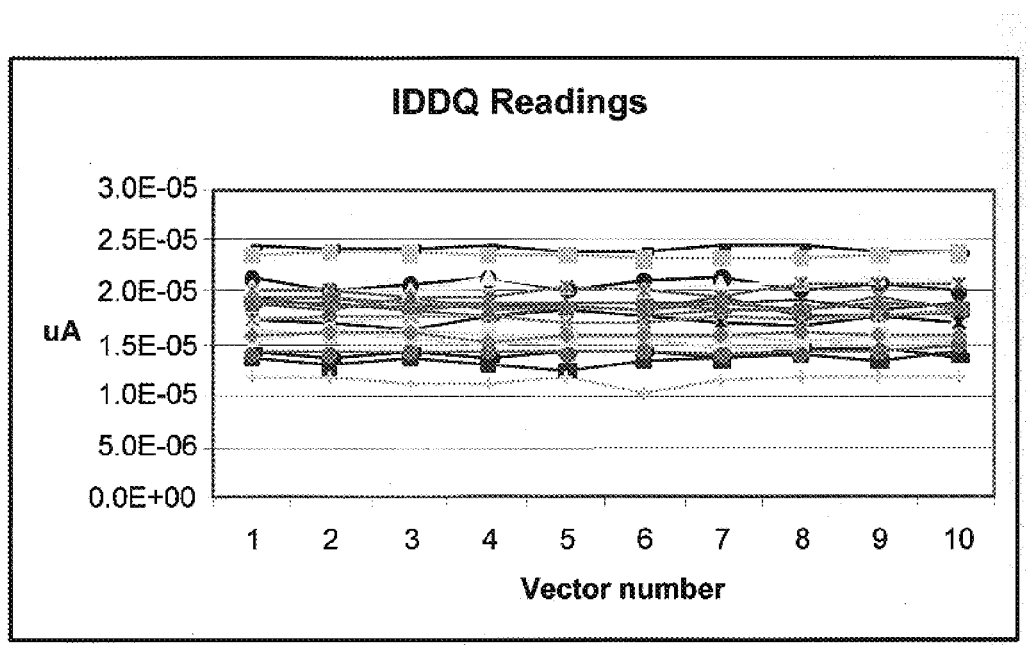
FIG. 3 shows absolute $I_{DDQ}$ levels for 20 'good' devices of a given test lot.

Typical readings for the good devices are ranging from 10 to 300 μA. The FIG. 3 below shows the readings of the first 20 good samples from the lot (ranging from 10 to 25 μA). The large range of 10-300 μA makes it difficult to define a satisfactory absolute 'pass' value for the good devices.

Figure 4:
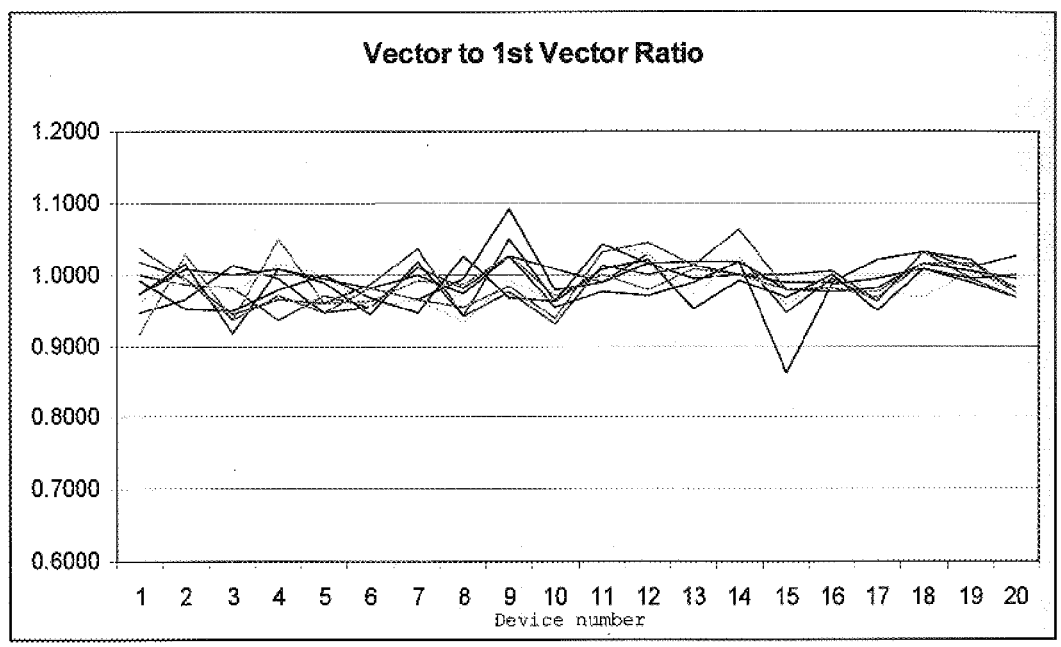
FIG. 4 shows the vector-to-first-vector $I_{DDQ}$ ratios of the twenty devices of FIG. 3, as a function of the device number, for a number of test vectors (each curve represents one test vector).
Figure 5:
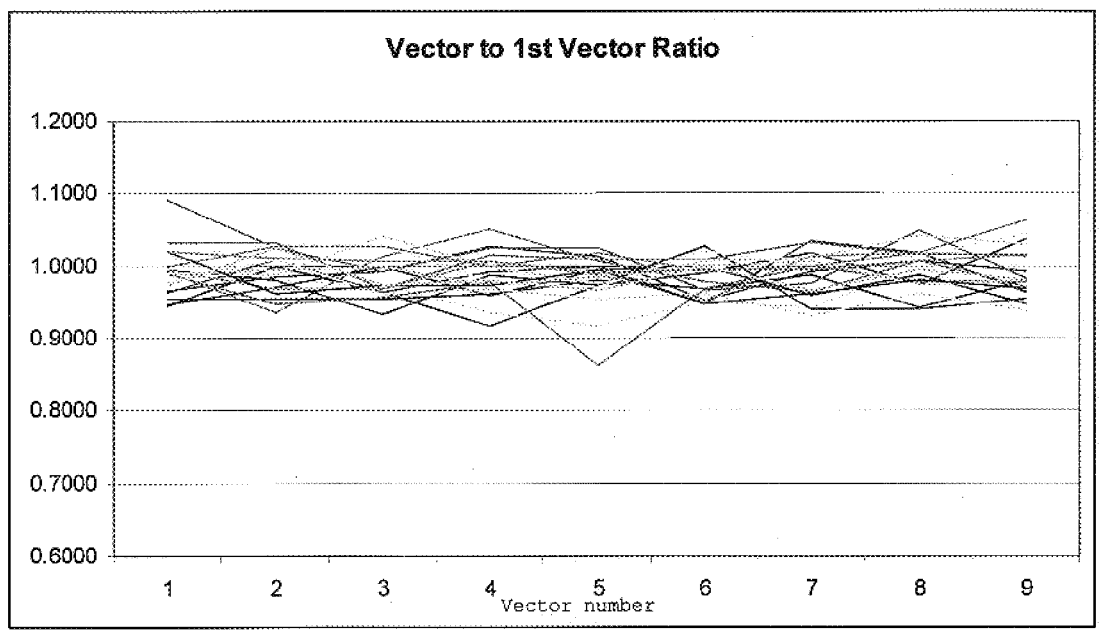
FIG. 5 shows the vector-to-first-vector $I_{DDQ}$ ratios of the twenty devices of FIG. 3, as a function of vector number (each curve represents one device).

The FIGS. 4 and 5 show the "vector to first vector" ratios for the same devices. Ratio values are ranging from 0.85 to 1.15. In FIG. 4, each line represents the ratio values for a particular device (20 devices, 10 IDDQ measurement points per device, resulting in 9 ratio values per device—X axis is device number). In FIG. 5, each line represents a particular device (X-axis is vector number). Once again, the ratios of the good devices are all relatively close to 1, making it easier to detect a fail.

Figure 6:
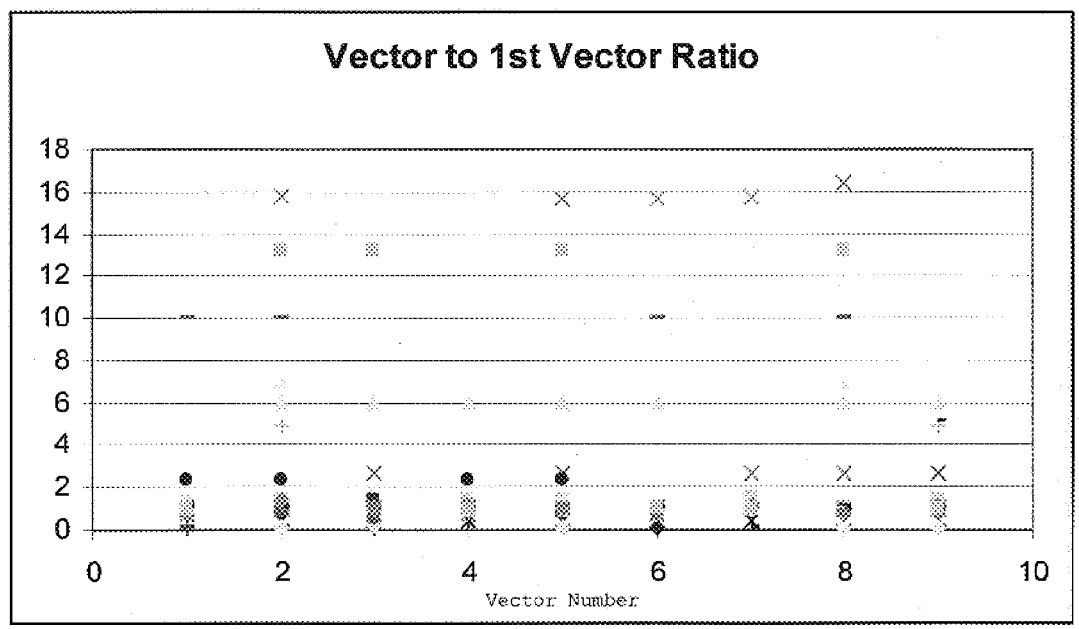
FIG. 6 represents a zoomed-in view of FIG. 5.

FIG. 6 shows the ratio values of 20 bad devices. Each symbol represents a particular device.

Example 3

Min-Max Curves

Figure 7:
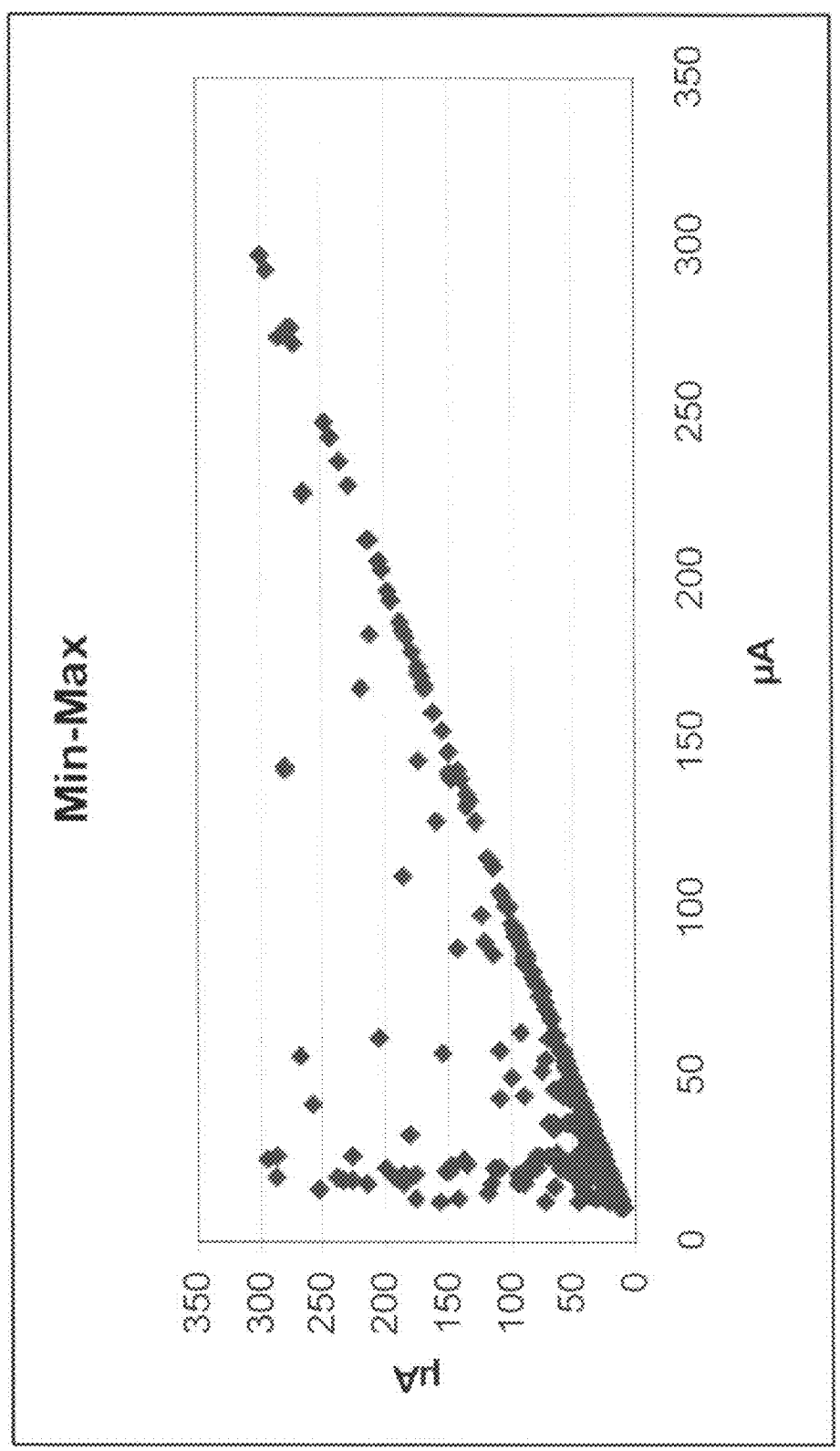
FIG. 7 represents the min-max curve of a batch of devices, showing the maximum $I_{DDQ}$ level as a function of the minimum $I_{DDQ}$ level, every dot representing one device of the batch.
Figure 8:
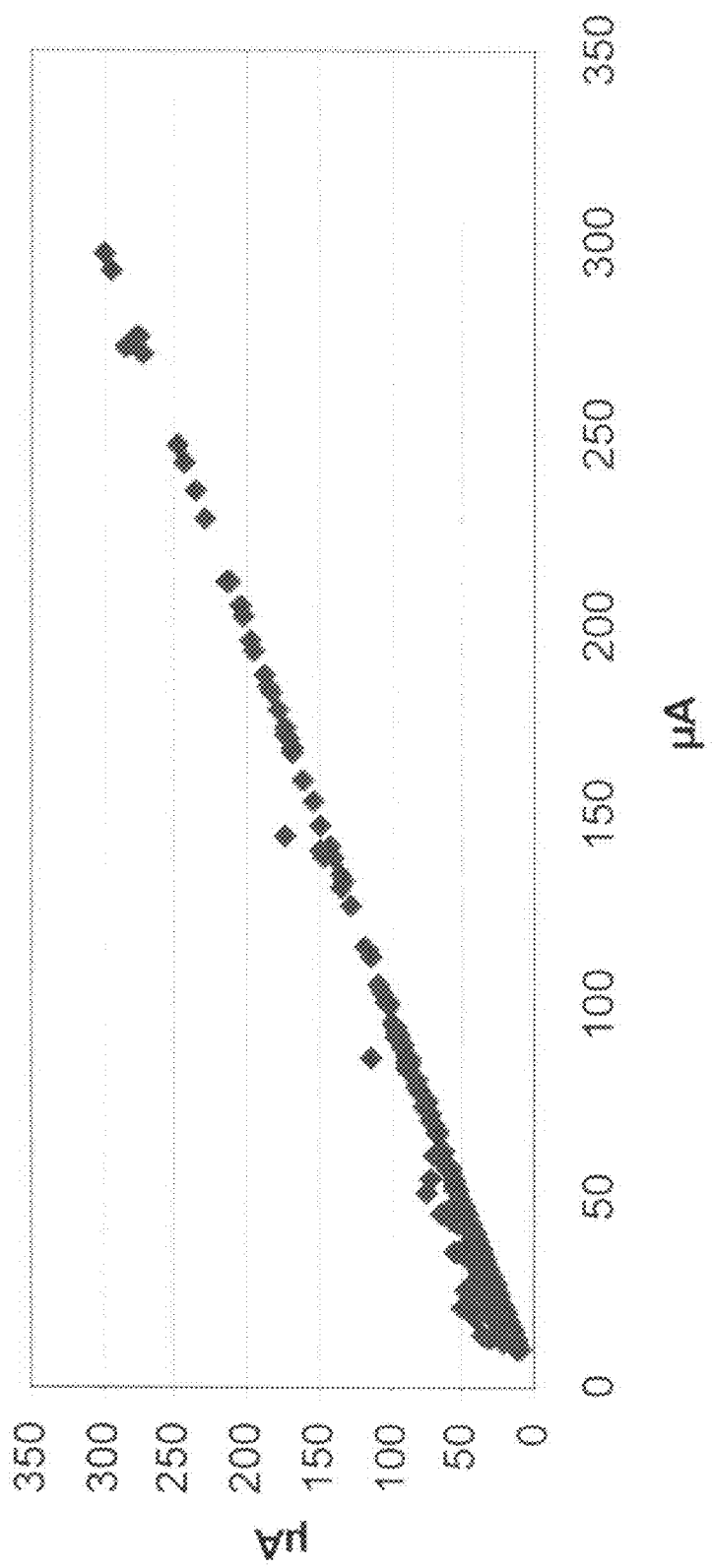
FIG. 8 shows the graph of FIG. 7, without outlier points.
Figure 9:
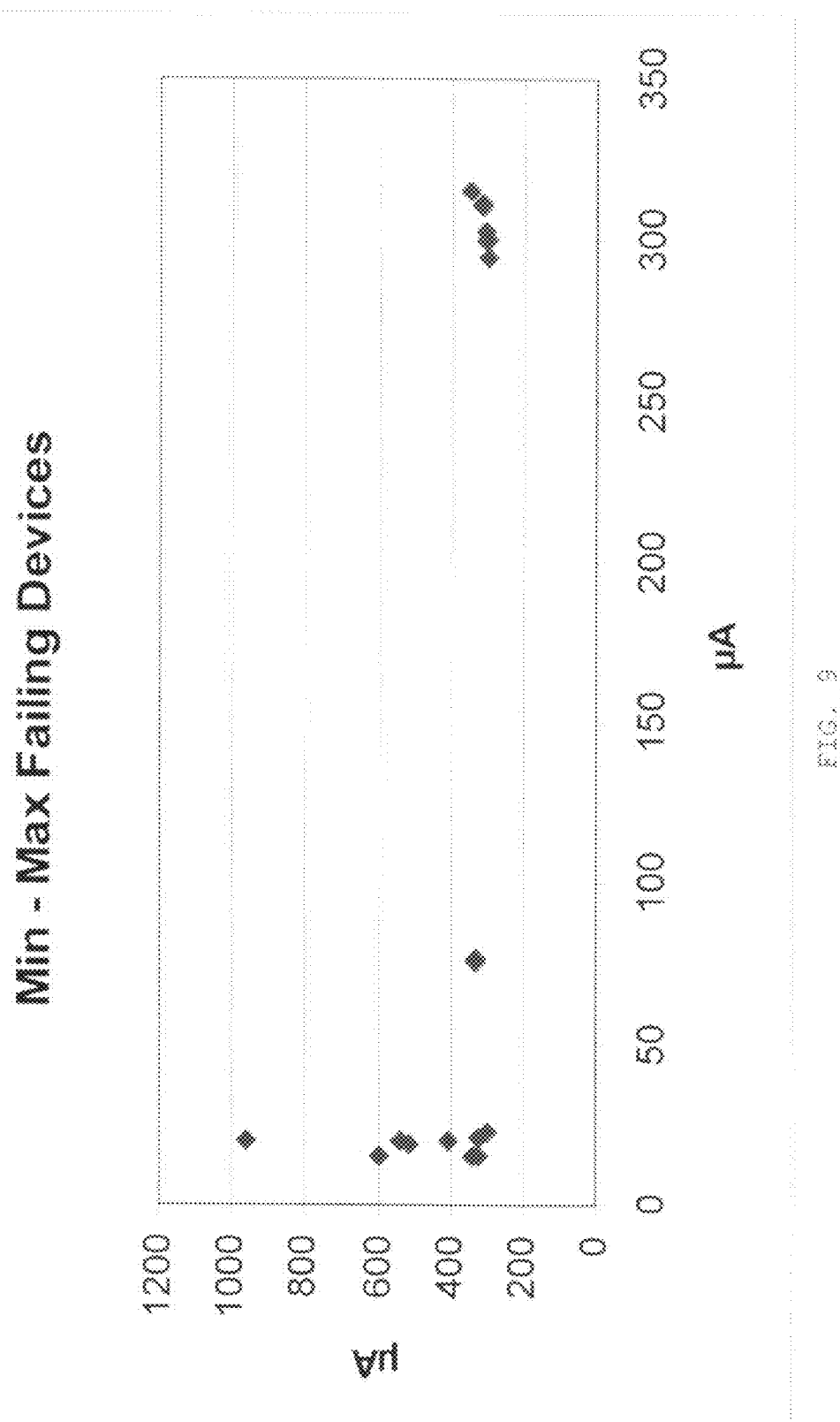
FIG. 9 shows a number of outlier points of FIG. 7, indicating failing devices.

FIGS. 7, 8 and 9 are related to the same production lot of example 2 containing 11420 devices with good readings between 10-300 μA, as well as a number of bad devices. The graphs show the relation between the minimum measured $I_{DDQ}$ value, and the maximum value, for a particular device. Each dot represents one particular device from the batch. For a good device, the min-max curve follows a straight line at 45° with the X-axis. This means that the minimum and maximum value are very close together, indicating that all measured $I_{DDQ}$ values are similar. This is typically true for a device to which the matching theory is applicable. The graphs show that for good devices, a large spread (in this case 10-300 μA) is possible from one device to the other, as far as the the absolute $I_{DDQ}$ levels are concerned, while different $I_{DDQ}$ levels measured on the same device differ very little, justifying a relative approach, wherein the relative $I_{DDQ}$ values should be close to 1.

FIG. 7 shows the min-max relation of all devices. FIG. 8 shows the min-max relation of all good devices after outlier removal. FIG. 9 shows the min-max relation of functional bad devices.

Figure 10:
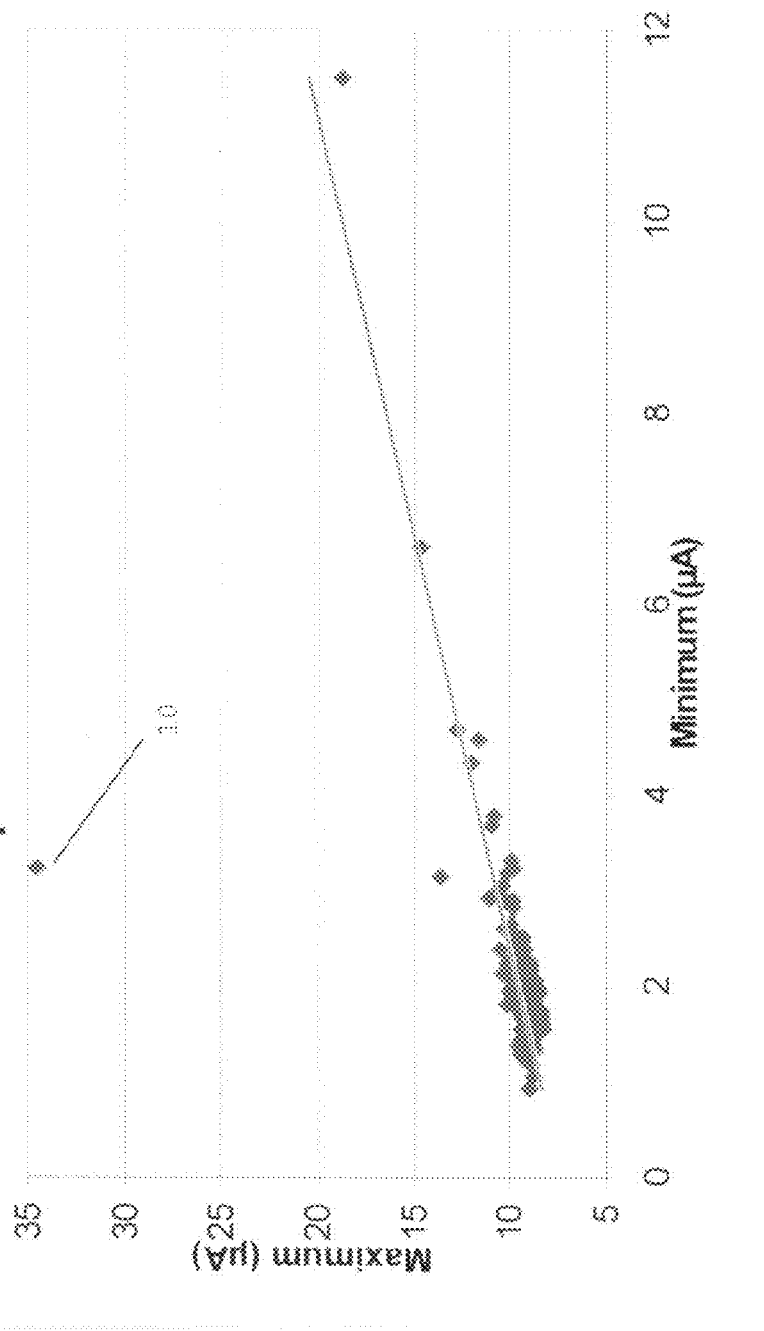
FIG. 10 is equally a min-max graph of a batch of devices.

Finally, FIG. 10 shows the min-max curve for a device which has digital as well as analog parts, and for which the matching theory does not apply. It can be seen that the curve does not follow the 45° line. In particular, the maximum $I_{DDQ}$ value is always significantly larger than the minimum value. However, for good devices, the min-max points still follow a straight line, while for bad devices, the points deviate from this line, such as is the case for point number 10.

For this type of device, the relative approach according to the invention is applicable, as long as the relative $I_{DDQ}$ levels are judged with respect to a reference value which can be derived from the angle of the min-max line for good devices.

In case the min-max curve for a good device follows a curve other than a straight line, a vector-dependent reference should be determined according to the method described above (golden device reference), as no fixed reference can be derived directly from the min-max curve.

The invention claimed is:

1. A method for testing a micro-electronic device, the method comprising:
    applying a plurality of test vectors to the device;
    measuring for each test vector a quiescent supply current to the device, wherein each quiescent supply current is a function of the test vector;
    dividing each measured supply current by another supply current value measured on the same device, comprising components that take part in the normal operation of the device under test, to obtain a result; and
    comparing the result to a predefined reference, thereby obtaining a pass or fail decision for the device.

2. The method of claim 1, wherein obtaining the pass or fail decision includes determining whether or not the result of the division is included within a range of values including the predefined reference.

3. The method of claim 1, wherein the predefined reference is a vector-related reference.

4. The method of claim 1, wherein said predefined reference equals 1.

5. The method of claim 1, wherein said predefined reference is derived from a graph showing a maximum measured supply current level as a function of a minimum measured supply current level, for a number of micro-electronic devices.

6. The method of claim 1, further comprising:
    comparing the measured value to an absolute reference and
    determining the pass or fail decision based on a combined result of both comparisons.

7. A method for testing a micro-electronic device, the method comprising:
    applying a plurality of test vectors to the device;
    measuring for each test vector a quiescent supply current to the device;
    dividing each measured supply current by a supply current value to obtain a result; and comparing the result to a predefined reference, thereby obtaining a pass or fail decision for said device, wherein the predefined reference is a vector-related reference obtained by:

obtaining a random production sample of micro-electronic devices of the same type, Choosing a reference test vector for each device of the sample, Measuring a supply current value of the chosen reference test vector for each device of the sample, Measuring a supply current value for each of the other supply current test vectors for each device of the sample, calculating a relative supply current value of each supply current measurement, by dividing each supply current measurement by the supply current value related to the chosen reference test vector, determining a mean and a sigma of the relative supply current for each supply current vector, for all devices of the sample, omitting all outlying relative supply current measurements for each supply current vector, for all devices of the sample, determining a mean and a sigma of the relative supply current values without the outlying relative supply current measurements, thereby obtaining the vector-related reference.

* * * * *